United States Patent [19]
Gray et al.

[11] Patent Number: 5,534,107
[45] Date of Patent: Jul. 9, 1996

[54] UV-ENHANCED DRY STRIPPING OF SILICON NITRIDE FILMS

[75] Inventors: David C. Gray, Sunnyvale, Calif.; Jeffery W. Butterbaugh, Chanhassen, Minn.

[73] Assignee: FSI International, Chaska, Minn.

[21] Appl. No.: 292,359

[22] Filed: Aug. 18, 1994

Related U.S. Application Data

[63] Continuation-in-part of Ser. No. 259,542, Jun. 14, 1994.
[51] Int. Cl.$^6$ .......................... H01L 21/00; C03C 15/00; B44C 1/22
[52] U.S. Cl. ........................ 156/643.1; 156/646.1; 156/657.1; 216/66; 216/79; 437/241
[58] Field of Search ............................ 156/643.1, 646.1, 156/653.1, 657.1, 659.11, 662.1; 216/63, 66, 67, 79; 437/228, 241, 242; 252/79.1

[56] References Cited

U.S. PATENT DOCUMENTS

| | | |
|---|---|---|
| 2,841,477 | 7/1958 | Hall . |
| 3,122,463 | 2/1964 | Ligenza et al. . |
| 3,669,774 | 6/1972 | Dismukes . |
| 4,065,369 | 12/1977 | Ogawa et al. . |
| 4,160,690 | 7/1979 | Shibagaki et al. . |
| 4,175,235 | 11/1979 | Niwa et al. . |
| 4,183,306 | 1/1980 | Niwa . |
| 4,183,780 | 1/1980 | McKenna et al. . |
| 4,314,875 | 2/1982 | Flamm . |
| 4,498,953 | 2/1985 | Cook et al. . |
| 4,522,674 | 6/1985 | Ninomiya et al. . |
| 4,540,466 | 9/1985 | Nishizawa . |
| 4,643,799 | 2/1987 | Tsuji et al. . |

(List continued on next page.)

FOREIGN PATENT DOCUMENTS

| | | |
|---|---|---|
| 063273 | 10/1982 | European Pat. Off. . |
| 57-200569 | 12/1982 | Japan . |
| 1180187 | 2/1970 | United Kingdom . |
| WO91/03075 | 3/1991 | WIPO . |

OTHER PUBLICATIONS

"Plasmaless dry etching of silicon with fluorine–containing compounds", J. Appl. Phys. 56(10), 15 Nov. 1984, pp. 2939–2942.

"CDE Patent Search—Technical Summary, Chemical Down Stream Etch Tools, Process, and Chemistry", Paul K. Aum, Jan. 7, 1994.

"Mechanisms of the HF/$H_2O$ Vapor Phase Etching of $SiO_2$," C. R. Helms and B. E. Deal, Journal of the IES, May/Jun. 1992, pp. 21–26.

(List continued on next page.)

*Primary Examiner*—William Powell
*Attorney, Agent, or Firm*—Vidas, Arrett, & Steinkraus

[57] ABSTRACT

A UV light-enhanced process for rapidly stripping films of silicon nitride in a dry reaction environment, which may be free of plasma or plasma effluents. This process is carried out in a sealed reactor which allows simultaneous exposure of a substrate wafer to a polyatomic fluorine containing gas which can be photodissociated by UV radiation to produce atomic fluorine and to UV radiation. Silicon nitride stripping rates in excess of 500 Å/min are readily obtainable with UV-stimulated fluorine-based processes, while maintaining the bulk wafer temperature below 300° C. Selectivities for silicon nitride-to-silicon oxide etching of greater than 30 can be achieved for the stripping of silicon nitride LOCOS mask layers in the presence of field oxide and pad oxide layers when a chlorine or bromine containing gas which can be photodissociated by UV radiation to produce atomic chlorine or bromine is used in mixture with the fluorine containing gas. Selectivity and etch rate are controlled through UV lamp exposure, substrate temperature, and additions of nitrogen diluent, and photodissociable chlorine or bromine containing gases. The process addresses many of the limitations of plasma-downstream etch tools for dry silicon nitride stripping, including complete elimination of charged particles and sputtered contaminants associated with plasma effluents.

35 Claims, 7 Drawing Sheets

U.S. PATENT DOCUMENTS

| | | |
|---|---|---|
| 4,678,536 | 7/1987 | Murayama et al. . |
| 4,687,544 | 8/1987 | Bersin . |
| 4,741,800 | 5/1988 | Yamazaki . |
| 4,749,440 | 6/1988 | Blackwood et al. . |
| 4,857,140 | 8/1989 | Loewenstein . |
| 4,871,416 | 10/1989 | Fukuda . |
| 4,938,815 | 7/1990 | McNeilly . |
| 5,022,961 | 6/1991 | Izumi et al. . |
| 5,028,560 | 7/1991 | Tsukamoto et al. . |
| 5,030,319 | 7/1991 | Nishino et al. . |
| 5,068,040 | 11/1991 | Jackson . |
| 5,178,682 | 1/1993 | Tsukamoto et al. . |
| 5,183,531 | 2/1993 | Terakado ............................... 156/643.1 |
| 5,201,994 | 4/1993 | Nonaka et al. . |
| 5,221,423 | 6/1993 | Sugino et al. . |
| 5,228,206 | 7/1993 | Grant et al. . |
| 5,234,540 | 8/1993 | Grant . |
| 5,236,602 | 8/1993 | Jackson . |
| 5,254,176 | 10/1993 | Ibuka et al. . |
| 5,431,772 | 7/1995 | Babie et al. ........................... 156/643.1 |
| 5,437,765 | 8/1995 | Loewenstein ............................... 216/51 |

OTHER PUBLICATIONS

"Native oxide removal on Si surface by $NF_3$ added hydrogen plasma downstream treatment", Jun Kikuchi, Masao Iga, Shuzo Fujimura and Hiroshi Yano, SPIE vol. 2091, pp. 154–159.

"Silicon Surface Cleaning Uisng Photoexcited Flourine Gas Diluted with Hydrogen", Takayuki Aoyama, Tatsuya Yamazaki, and Tokashi Ito, J. Electrochem. Soc., vol. 140, No. 6, Jun. 1993, pp. 1704–1708.

"A Dry Etching Technology Using Long–Lived Active Species Excited by Microwave", Y. Horike and M. Shibagaki, Toshiba Research and Development Center, Tokoyo Shibaura Electric Co., Ltd. Kawasaki, Japan.

"Highly Selective Etching of $Si_3N_4$ to $SiO_2$ Employing Fluorine and Chlorine Atoms Generated by Microwave Discharge", S. Suto, N. Hayasaka, H. Okano, and Y. Horike, J. Electrochem. Soc. vol. 136, No. 7, Jul. 1989, pp. 2032–2034.

"Directional Dry Etching of Silicon by a Reactive Nozzle––Jet", Hideo Akiya, Proc. of DPS, pp. 119–126, Oct. 1981, Tokyo, Japan.

"Pad Oxide Roughening in a Remote Plasma Etch Process for Silicon Nitride Using an *In Situ* Spectral Ellipsometer", Lee M. Loewenstein, Rod K. Pohlmeier, Stephanie Watts Butler, Steven A. Henck and Walter M. Duncan, Proc. of ECS, vol. 93(21), pp. 373, 1993.

"Selective etching of silicon nitride using remote plasmas of $CF_4$ and $SF_6$", Lee M. Loewenstein, J. Vac. Sci. Technol. A vol. 7, No. 3, May/Jun. 1989, pp. 686–1394.

"Selective Isotropic Dry Etching of $Si_3N_4$ over $SiO_2$", F. H. M. Sanders, J. Dieleman, H. J. B. Peters, and J. A. M. Sanders, J. Electrochemical Soc. vol. 129, No. 11, pp. 2559–2561.

"Highly Selective Etching in $Si_3N_4$ Over $SiO_2$ Employing a Downstream Type Reactor", N. Hayasaka, H. Okano, Y. Horike, Solid State Technology, Apr. 1988, pp. 127–130.

"Initiation Phenomena in Pulsed Chemical Lasers", James P. Moran, R. Bruce Doak, Prepared for Naval Research Laboratory, Oct. 1978.

"Photochemistry of Interhalogen Compounds of Interest as Rocket Propellants", Arthur E. Axworthy, R. D. Wilson, K. H. Mueller, prepared for Air Force Office of Scientific Research, Sep. 1973.

"Plasmaless Dry Etching of Silicon Nitride Films with Chlorine Trifluoride Gas", Yoji Saito, Masahiro Hirabaru, Akira Yoshida, IEICE Trans. Electron, vol. E75–C, No. 7, Jul. 1992, pp. 834–838.

"Plasmaless Cleaning Process of Silicon Surface Using Chlorine Trifluoride" by Yoji Saito, Osamu Yamaoka et al., *Appl. Phys. Lett.* 56 (12) 19 Mar. 1990, *Appl. Phys. Lett* 56 (12)., 19 Mar. 1990, pp. 1119–1121.

"Selective Etching of Native Oxide by Dry Processing Using Ultra Clean Anhydrous Hydrogen Fluoride" by N. Miki et al., 730 IEDM 88.

"Selective Interhalogen Etching of Tantalum Compounds and Other Semiconductor Materials" by D. E. Ibbotson et al., *Appl. Phys. Lett.* 46(8), 15 Apr. 1985, pp. 794–796.

"Characterization of Wafer Cleaning and Oxide Etching Using Vapor–Phase Hydrogen Fluoride" by M. Wong et al., *J. Electrochem. Soc.*, vol. 138, No. 6, Jun. 1991, pp. 1799–1802.

"Wafer Temperature Dependence of the Vapor–Phase HF Oxide Etch" by Man Wang et al., *J. Electrochem. Soc.*, vol. 140, No. 1, pp. 205–208.

"Vapor Phase Cleaning of Submicron Inter–Metal Vias" by Daniel P. Gay et al., *FSI Technical Report*, TR397, Nov. 5, 1993.

"A New Cleaning method by Using Anhydrous $HF/CH_3OH$ Vapor System" by Izumi et al., *EOS Proceedings*, vol. 92–12 (1992), pp. 260∝267.

"Etching of Thermal Oxides in Low Pressure Anhydrous $HF/CH_3OH$ Gas Mixture at Elevated Temperature", by J. Ruzyllo et al., *J. Electrochem. Soc.*, vol. 140, No. 4, Apr. 1993, pp. L64∝L66.

Abstract: Pat. No. 3,511,727 to Hays, issued May 7, 1912.

Abstract: Pat. No. 5,240,554 to Hayaski Hisataka, issued Aug. 31, 1993.

Abstract: Pat. No. 5,122,225 to Monte issued Jun. 16, 1992.

Abstract: Pat. No. 5,094,978 to Miyagaki Shinji et al. issued Mar. 10, 1992.

Abstract: Pat. No. 4,717,447 to Dieleman issued Jan. 5, 1988.

Abstract: Pat. No. 4,574,177 to Wang issued Mar. 4, 1986.

Abstract: Pat. No. 4,125,672 to Kakushi et al. issued Jan. 14, 1978.

Abstract: Pat. No. 4,440,883 to Pammer Erich issued Apr. 3, 1984.

Abstract: Pat. No. 4,310,380 to Flamm issued Jan. 12, 1982.

Abstract: Pat. No. 5,069,724 to Fujii et al. issued Dec. 3, 1991.

Abstract: Pat. No. 4,799,991 to Dockrey issued Jan. 24, 1989.

UV-ENHANCED DRY STRIPPING OF SILICON NITRIDE FILMS

CROSS-REFERENCE TO RELATED APPLICATION

This application is a continuation-in-part of Ser. No. 08/259,542, filed Jun. 14, 1994, incorporated herein by reference.

BACKGROUND OF THE INVENTION

Chemical vapor deposited (CVD) and plasma enhanced chemical vapor deposited (PECVD) silicon nitride films have important applications in advanced integrated circuits manufacture. Specific applications include masking layers for local oxidation of silicon (LOCOS), passivation layers and diffusion barriers, and final mechanical protection layers for IC's. A favored method for isolating active regions in advanced CMOS manufacturing is the poly-buffered LOCOS process (PBL), described in Lin, T., N. Tsai and C. Yoo, "Twin-White-Ribbon Effect and Pit Formation Mechanism in PBLOCOS", *J. Electrochem. Soc.*, 138(7), 1991, p 2145, which involves a "stack" of silicon oxide/polysilicon/silicon nitride on a silicon substrate. The silicon oxide "pad" layer is typically 10 nm, while the polysilicon and top silicon nitride layer are typically 50 nm and 250 nm, respectively. After deposition of this composite film over the silicon substrate, active device regions are masked and an anisotropic plasma etching process is typically used to etch the open or "field" regions down to the pad oxide. The wafer is subsequently subjected to a thermal oxidation process for growth of the "field oxide" in the etched areas, which is typically 500 nm in thickness. This process also leaves a thin oxynitride film on top of the silicon nitride. After the field oxide is grown, the stack is removed.

Currently, removal of the PBL stack from the active device regions is done in wet chemical process steps which include an HF acid solution for etching or "deglaze" of the top oxynitride layer, followed by removal of the silicon nitride layer in a hot phosphoric acid solution. The polysilicon layer is subsequently removed in an additional dry etching process, while the "pad" oxide may be stripped using a wet or dry process. There is great impetus for replacing this complicated wet/dry process sequence with a dry method capable of removing the entire PBL stack. This replacement would have benefits not only from the viewpoint of process clusterability, but also from the elimination of hot phosphoric acid from the process sequence. Hot phosphoric acid poses a safety and environmental hazard, is difficult to handle, and is typically one of the most contaminated chemicals in the fabricating laboratory.

In general, a dry LOCOS isolation stack removal process would be required to rapidly etch silicon nitride (and polysilicon), while achieving a selectivity, for silicon nitride over silicon oxide, of greater than 15. The latter requirement limits the removal of field oxide during the nitride stripping process, and prevents thinning or punch through of the pad oxide during an over etch condition.

Dry processes which have been evaluated for nitride LOCOS mask stripping applications include plasma etching, plasma downstream etching, and plasmaless etching of silicon nitride using fluorine interhalogen and other spontaneously reactive gases.

Akiya, *Proc. of Dry. Proc. Symp.*, Oct. 1981, Tokyo, p 19, demonstrated in a plasma beam experiment that F atoms produced in an upstream $CF_4$—$O_2$ RF discharge spontaneously etch silicon nitride ($Si_3N_4$) at appreciable rates, while thermal $SiO_2$ and PSG (phosphorous doped silica glass) were etched much more slowly.

Sanders et al., *J. Electrochem. Soc.*, 129(11), 1982, p 2559, studied the selective isotropic dry etching of $Si_3N_4$ over $SiO_2$ using $CF_4$—$O_2$ mixtures in a commercial barrel etcher, and found that additions of $CF_3Br$ increased selectivity for the nitride from 5 to over 20. They further suggested that there was an increasing effect on nitride selectivity as one added other halogens to the base fluorine chemistry, in the order of chlorine, bromine, iodine.

Suto et al. *J. Electrochem. Soc.* 136(7), 1989, p 2032, studied $Si_3N_4$ to $SiO_2$ selectivity in a downstream microwave plasma process, where additions of $Cl_2$ to a $NF_3$ discharge chemistry were found to greatly enhance nitride selectivity.

Lowenstein, et al., *J. Vac. Sci. Technol. A*, 7(3), 1989, p 686; *J. Electrochem. Soc.*, 138(5), 1991, p 1389; and *Proc. of ECS*, 93(21), 1993, p 373, have characterized the etching of LOCOS isolation structures in a microwave-based remote plasma reactor. In these references, the effect of substrate temperature, as well as hydrogen additions on the etching selectivity of silicon nitride to thermal $SiO_2$ and polysilicon, have been detailed and the removal of silicon oxynitride in a similar dry process was also compared to conventional wet hot phosphoric acid process. All of these references, however, pertain to plasma etch systems. Direct plasma etch systems are generally unacceptable due to various types of charge and ballistic damages which are created in the active device regions. Downstream plasma systems for dry stripping of silicon nitride which expose the substrate to plasma effluent, rather than to the plasma glow region, have disadvantages which include the deposition of sputtered contaminants in the plasma tube onto the wafer, the strong effect of transport tube material and geometry on the wafer chemistry, the exposure of the wafer to residual charge flux and long lived high energy metastables, and process sensitivity to reactor conditioning effects. Accordingly there is a need for a dry plasma-free process for stripping silicon nitride from wafer substrates.

Ibbotson et al., *Appl. Phys. Lett.*, 46(10), 1984 p 2939, demonstrated that plasma deposited silicon nitride and LPCVD $Si_3N_4$ could be etched at an appreciable rate in a plasma-free process using only vapors of chlorine trifluoride ($ClF_3$), while thermal $SiO_2$ was not etched at detectable rates.

Saito et al., *IEICE Trans. Electron*, E75-C(7), July 1992, p834, have further studied the "plasmaless etching" of thermally grown, sputtered, and plasma deposited silicon nitride films with $ClF_3$ vapors. Low intensity UV exposure of thermal silicon nitride during $ClF_3$ etching was found to reduce the induction time before the onset of etching, and to increase $ClF_3$—$Si_3N_4$ etching rates by about a factor of 2. Under the conditions studied, selectivity of $Si_3N_4$ was reported to be greater than 100, however, the nitride etching rates reported were under 5 Å/min.

In copending application Ser. No. 08/259,542, filed Jun. 14, 1994, it is disclosed that selectivity between various forms of silicon oxide is reduced to a factor of near 1:1 when a substrate containing several types of silicon oxide is exposed to a plasma-free gaseous environment comprising a photodisassociable fluorine containing gas and irradiated with UV.

SUMMARY OF THE INVENTION

The current invention is a dry process for removing a film of silicon nitride from a substrate. The process can achieve removal at rates in excess of 100 Å/minute, and in some cases over 500 Å/minute. This result is preferably achieved in the absence of a plasma or plasma effluent which simplifies the process and minimizes damage to the wafer and underlying material. The invention also allows removal of a film of silicon nitride in the presence of silicon oxide while minimizing the removal of the silicon oxide. Specific application of this process may be in the stripping of the silicon nitride mask following a LOCOS or a poly-buffered-LOCOS (PBL) process.

The invention provides several advantages over the use of hot phosphoric acid. First, hot phosphoric acid is a safety hazard due to the presence of large quantities of highly reactive, hot liquid. This invention uses only dry gases as the reactive species. Second, phosphoric acid is one of the dirtiest chemicals in the industry. The invention uses gases that can be readily obtained at very high purity levels. Third, the hot phosphoric process generates and deposits particles on wafers. This invention is, at worst, particle neutral. Fourth, phosphate waste from the hot phosphoric acid process is a major pollutant. The waste generated from the scrubbing of the gaseous exhaust from this invention is only a small fraction of the waste generated from the hot phosphoric process. Thus the invention overcomes the limitations of the current hot phosphoric acid stripping of silicon nitride LOCOS films, while maintaining high selectivity against the underlying pad oxide.

Other applications exist where it is desirable to strip silicon nitride film in the manufacturing of semiconductor devices. The present invention may also be employed to strip silicon nitride in such applications. In particular, the high selectivity for silicon nitride over silicon oxide can be readily exploited in circumstances where different forms of silicon oxide are present and are desirably retained relative to silicon nitride. The different forms of silicon oxide may include CVD oxide, thermal oxide and doped oxides such as boron and phosphorus doped silica glass (BPSG), phosphorous doped silica glass (PSG), boron doped silica glass (BSG), and spin on glass (SOG).

The invention, in one aspect, is a method of removing silicon nitride from a substrate, the method comprising:

placing the substrate in a gaseous environment comprising at least one first gas and at least one second gas, the first gas being a fluorine-containing gas which can be photodissociated by UV radiation to produce atomic fluorine and the second gas being a chlorine-containing or a bromine containing gas which can be photodissociated by UV radiation to produce atomic chlorine or bromine, and exposing the substrate to UV irradiation in the presence of the gaseous environment. Examples of suitable fluorine containing gases are fluorine, fluorine interhalogens, especially $ClF_3$, fluorides of sulfur and xenon difluoride.

In a further aspect the invention is a method of removing silicon nitride from a substrate, the method comprising:

placing the substrate in a gaseous environment comprising at least one first gas, the first gas being a fluorine-containing gas which can be photodissociated by UV radiation to produce atomic fluorine, and exposing the substrate to UV irradiation in the presence of the gaseous environment, wherein the integrated intensity of the UV irradiation at the substrate surface over the range of 180–400 nm is at least 50 mW/cm$^2$, the temperature of the substrate before irradiation is in the range of 20°–400° C., and the partial pressure of said first gas is at least 10 torr.

DETAILED DESCRIPTION OF THE INVENTION

The process of the invention is achieved by simultaneously exposing the wafer surface to ultraviolet (UV) illumination and a gaseous environment containing a fluorine containing gas which is photolysable by UV, such as chlorine trifluoride ($ClF_3$) or $F_2$. In a preferred embodiment a second, a chlorine-containing or a bromine-containing gas which can be photodissociated by UV radiation to produce atomic chlorine or bromine, is also employed in the gaseous environment. Typical conditions include a total gas pressure of 100 torr, total flow rate of 1000 sccm, $ClF_3$ fraction of 1% to 90%, $Cl_2$ fraction of 1% to 50% and a starting temperature of 40° C. UV irradiation may be provided with a medium pressure mercury vapor discharge lamp.

For purposes of this invention, UV radiation is actinic radiation in the range of 180–400 nm.

In practice of the inventive method, a source of the fluorine-containing gas is connected to a processing chamber containing the substrate material to be etched or cleaned. The processing chamber suitably comprises a vacuum vessel constructed of chemically inert material, which is hermetically sealed from the ambient atmosphere and can be evacuated to better than 20 millitorr base pressure by means of suitable vacuum apparatus. The processing chamber is evacuated to a low base pressure, for example 20 millitorr. The substrate is desirably introduced into the processing chamber through an isolated load-lock chamber which can be pumped down to a similar base pressure. Introduction or removal of the substrate from the process chamber occurs through the load-lock chamber to prevent the introduction of atmospheric contaminants, particularly water vapor, into the process chamber. Alternatively, the substrate may be introduced into the chamber before evacuation.

The process chamber may also share a transfer interface with a vacuum cluster robotic transfer unit which allows sequential transfer of substrate materials to or from other process modules without exposure to ambient atmosphere.

A fluorine-containing gas such as $ClF_3$ is introduced into the process chamber to produce a gaseous environment in which the fluorine containing gas forms a substantial partial pressure over the substrate, suitably in the range of 10–760 torr. Preferably the fluorine containing gas is introduced at a partial pressure of at least 20 torr, more preferably about 50 torr or greater. Suitable fluorine containing gases usable in the invention include, in addition to $ClF_3$, other fluorine interhalogens such as bromine trifluoride, bromine pentafluoride, and iodine pentafluoride, and also fluorine, sulfur hexafluoride and xenon difluoride. Fluorine containing gases which are not readily photodissociated by UV radiation, such as $NF_3$, are not suitable for use as the fluorine containing gas.

In one embodiment a second gas which provides a source of atomic chlorine or bromine by photodissociation, for instance chlorine, bromine, $CCl_4$, chlorofluorocarbons such as $CF_3Cl$ and bromofluorocarbons such as $CF_3Br$, is also introduced into the process chamber. Preferred second gases are chlorine and bromine, with chlorine most preferred. The second gas can be employed at a partial pressure in the range of 1 mtorr–760 torr. Preferably the ratio of the partial pressures of the fluorine-containing gas and the second gas is from 2:1–1:2. A preferred gas mixture is a mixture of $ClF_3$ and $Cl_2$ at partial pressures of about 50 torr each.

An inert gas or mixture of inert gases may also be introduced into the chamber. The inert gas may be any gas which is inert to the materials to be treated and which will remain in the gaseous phase under the processing conditions present. Suitable inert gases include nitrogen, argon, and helium.

The process preferably is conducted in the substantial absence of a plasma or plasma products, such as a downstream plasma effluent. That is, the gases of the gaseous environment are preferably introduced to the reaction vessel in their atomic ground state. However, the use of a photolyzable fluorine containing gas in the gaseous environment under the conditions described herein also provides advantages in achieving silicon nitride etching when the gaseous environment includes plasma products from an upstream plasma generator. For instance, the fluorine containing gas and/or the chlorine or bromine containing gas may be excited with an upstream plasma generating source such as a radio frequency source or a microwave source in an apparatus as described in U.S. Pat. No. 4,741,800 or U.S. Pat. No. 4,687,544.

For safety reasons, the total gas pressure is desirably maintained at or below atmospheric pressure.

The fluorine containing gas or gas mixture may be introduced into the processing chamber in a manner which creates a uniform radial laminar flow pattern over the substrate, for instance through a gas distribution showerhead. In this manner removal of etching products and contaminants is facilitated through entrainment in the laminar flow stream. However, the present invention may be accomplished using other reactive gas flow patterns or in an approximately stagnant gaseous environment.

Both the fluorine-containing gas phase above the substrate and the substrate surface to be processed are illuminated with UV light, suitably through a UV transparent window in the processing chamber. Broadband UV radiation in the wavelength range of 180–600 nm may be used, as may narrower band sources providing substantial output in the 180–420 nm range. Suitable sources are medium pressure Hg lamps and xenon flash lamps. The UV radiation may be pulsed or continuous. Ozone-free UV sources providing little or no output in the 180–239 nm range may also be suitably employed. A laser and suitable optics may also be used to generate the required UV photon flux. Silicon nitride removal rates may be controlled to a large degree by the intensity of the UV radiation, the UV photon energy, the UV exposure time and/or the UV lamp or laser pulsing rate.

The intensity of the UV irradiation over the range of 180–400 nm is desirably at least 50 mW/cm$^2$, preferably at least 200 mW/cm$^2$. A typical broadband UV source useful in the invention will provide an integrated intensity over the 180–400 nm range of about 250 mW/cm$^2$ with a intensity at 254±5 nm of about 25 mW/cm$^2$. An ozone free source providing at least 50 mW/cm$^2$, preferably at least 200 mW/cm$^2$ in the range of 240–400 nm can be used and provide important safety advantages over ozone generating sources. For purposes of this invention UV irradiation intensities are determined at the substrate surface.

The temperature of the substrate before onset of irradiation is desirably in the range of 20–400° C., more preferably at least 150° C., and no more than 250° C.

Following treatment, the processing chamber is evacuated and the substrate is removed.

Figure 1:
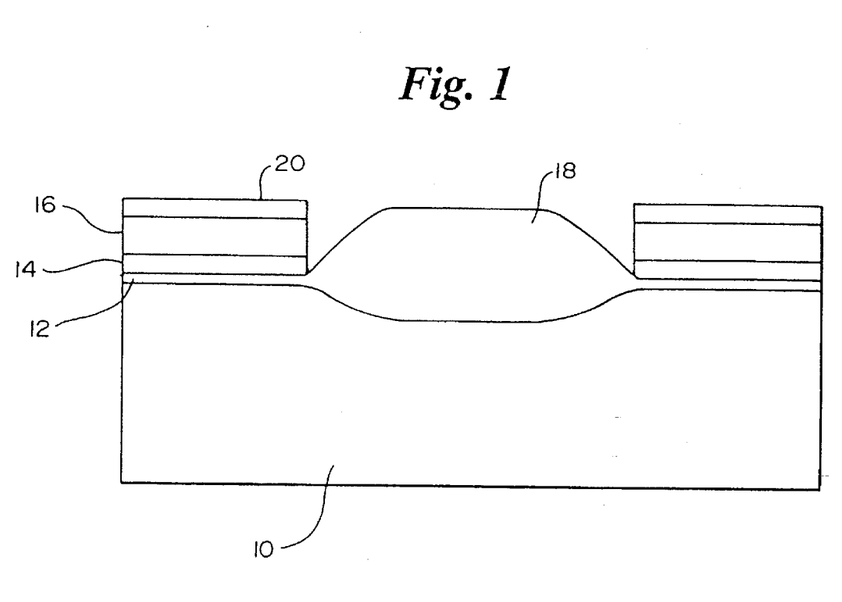
FIG. 1 is a schematic cross section of a silicon wafer having a PBL stack to be removed.

As noted above one particular application of the process of the invention is in the removal of silicon nitride mask following a LOCOS or a PBL process. Referring to FIG. 1, there is shown a silicon wafer substrate 10 on which a PBL stack has been built. The PBL stack consists of successive layers of "pad" silicon oxide 12, typically 100 Å thick, polysilicon 14, typically 500 Å thick, and a layer of silicon nitride 16, typically 2500 Å thick. After the PBL stack is built it is masked, etched, and then "field oxide" layer 18 built up in the unmasked etched areas. The field oxide build up step produces a thin silicon oxynitride layer 20 at the top of the PBL stack. Following the buildup of layer 18, the PBL stack is removed down to the pad oxide layer. That is, layers 20, 16 and 14 are removed. The process of the present accomplishes that removal efficiently.

The invention is illustrated by the following non-limiting examples.

Examples

The reactor used in these studies was a prototype single wafer vacuum cluster module capable of conducting UV-enhanced processing of 100, 150, or 200 mm wafers, and interfaced to a vacuum cluster robotic handler. The reactor module was constructed of 6061 aluminum, which has undergone a hard coating process rendering it impervious to attack by HF and HCl vapors, as well as halogen radicals. For the purpose of these studies a dry rough pump was used to pump the vacuum reactor to base pressure below 10 mtorr. High purity sapphire windows were used to allow UV (and/or IR) light exposure of the wafer front side, the sapphire material also being impervious to attack by process chemistries. Gases were introduced over the wafer in a radial laminar flow pattern, enhancing the transport of etching products and particulates away from the wafer surface. High intensity (10–50 mw/cm$^2$ at 254 nm), broad band UV radiation was generated for the purpose of these studies using commercially available medium pressure mercury discharge ozone producing and ozone-free lamps. The high energy cutoff for the ozone-free lamp is at about 245 nm, while the cut off for the ozone producing lamp is at about 180 nm. Unless otherwise noted, data presented in this study was taken using the ozone-producing lamp.

The wafer pre-process temperature was controlled using a proximity heater, typically in the range of 50° to 150° C. During the period of UV exposure, typically 30 to 60 seconds, the wafer temperatures were transient due to IR output from the UV lamps. However, the wafer temperature typically did not exceed 300° C. during processing.

Gases used in this study included Air Products C. P. Grade (99.0%) $ClF_3$ and Scientific Gas Products VLSI grade $Cl_2$ (99.998%). Dry nitrogen used in these studies was from an $LN_2$ vapor delivery system, and typically had below 10 ppm $H_2O$ impurity. 2000 Å LPCVD silicon nitride ($Si_3N_4$) films were prepared over a 200 Å pad of thermal oxide for nitride etching studies. 5000 Å BPSG (3% B/3% P) films and 4000 Å steam growth thermal oxide were used for oxide etching selectivity studies. All work presented herein was conducted on 150 mm p-Si<100> substrate wafers. Film thicknesses preceding and following etching process were measured optically.

EXAMPLE 1

Figure 2:
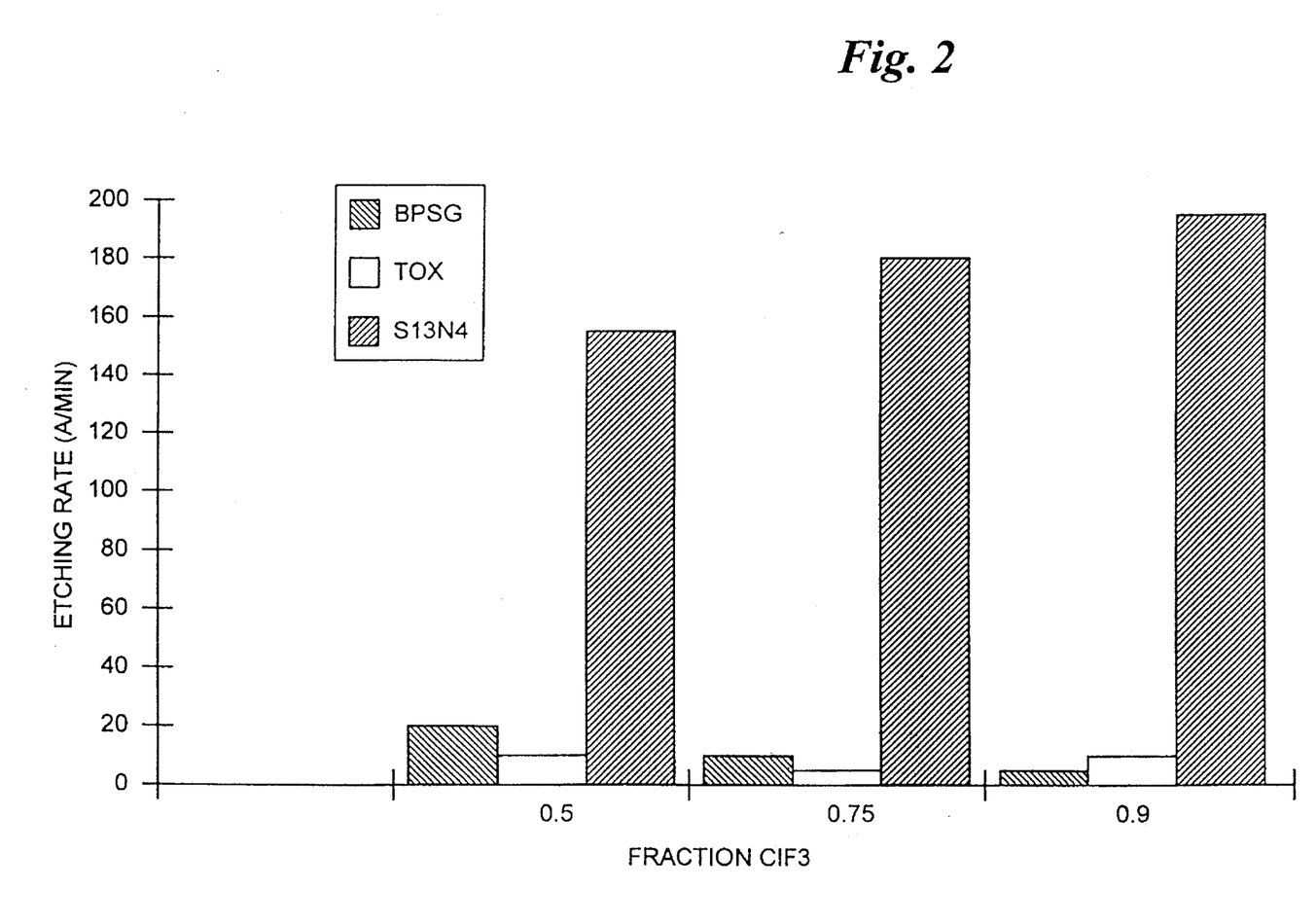
FIG. 2 is a graph of UV-enhanced $ClF_3$ etching rates for $Si_3N_4$, thermal oxide, and BPSG at low (50° C.) initial wafer temperature.
Figure 3:
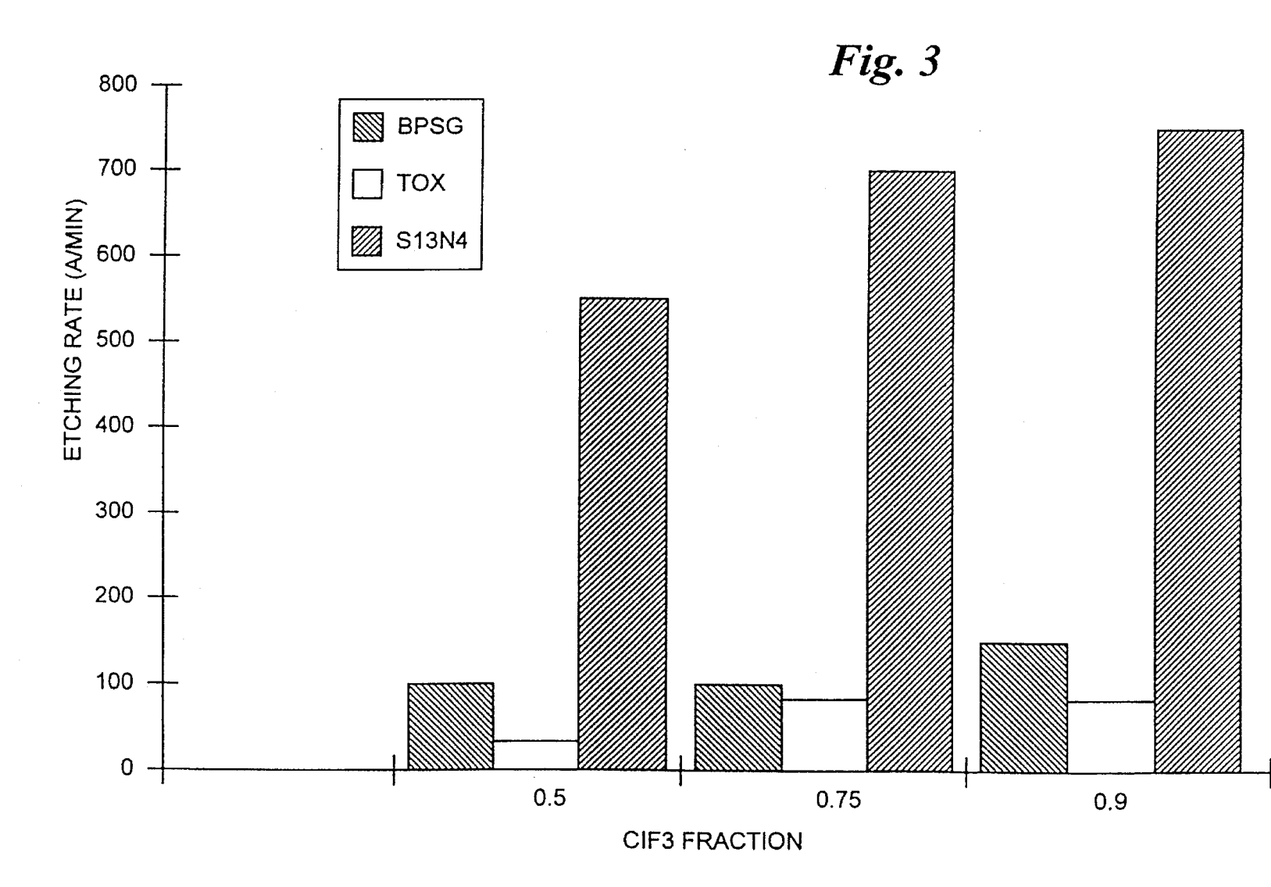
FIG. 3 is a graph of UV-enhanced $ClF_3$ etching rates for $Si_3N_4$, thermal oxide, and BPSG at high (150° C.) initial wafer temperature level.

The rate of etching $Si_3N_4$ is compared to that for thermal silicon oxide and densified BPSG at high $ClF_3$ flow fractions and two different levels of temperature in FIGS. 2 and 3. Total flow in these studies was held at 1000 sccm using dry nitrogen as a diluent, while total reactor pressure was held at 100 torr. Computational and experimental studies have shown that these conditions lead to uniform gas distribution over a 150 mm wafer in the present reactor configuration. Preceding the dry strip processes, all wafers were subjected to a standardized cleaning procedure to establish a consistent pre-etch state for the substrate surfaces. The wafer carrier was then inserted into a vacuum cluster robot elevator which was evacuated to below 10 mtorr. Wafers were inserted into the process module by the handler under vacuum. The flow of gaseous reactants to the module was started about 30 seconds prior to starting UV exposure to allow the reactor pressure to stabilize at 100 torr. Wafers were exposed to UV light for 1–5 minutes, depending on the film being etched and experimental conditions, after which the UV exposure was stopped and the reaction chamber was pumped to base pressure and purged with dry nitrogen.

Silicon nitride and silicon oxide UV/$ClF_3$ etching rates are compared for $ClF_3$ flow fractions of 0.5, 0.75, and 0.9 in FIG. 2, where the initial substrate temperature was 50° C. Silicon nitride etching rates were found to increase with flow fraction from 160 to 200 Å/min in these low temperature studies, while etching of the doped and undoped oxides was typically under 10 Å/min. Etching selectivity exceeded 20 for the highest $ClF_3$ flow fraction. However, under these conditions the nitride etching rates were impractically low.

Increasing the substrate starting temperature to 150° C. (FIG. 3) increased both the $Si_3N_4$ and silicon oxide etching rates substantially, indicating a positive activation energy in both cases. However, the results of FIG. 3 indicate that temperature has a disproportionate effect in increasing silicon oxide etching rates so that UV/$ClF_3$ $SiO_2$ etching is more strongly thermally activated. Consequently, while $Si_3N_4$ etching rates reach 800 Å/min at this temperature, nitride-to-oxide selectivity falls to about 8-to-1.

EXAMPLE 2

The results of Example 1 indicate that it is possible to greatly enhance $Si_3N_4$ etching rates by increasing substrate temperature, UV intensity, and/or $ClF_3$ concentration, but typically at the expense of etching selectivity to thermal oxide. This example demonstrates the UV-enhanced process chemistry of the invention which achieves both high $Si_3N_4$ etching rates and high selectivity.

Figure 4:
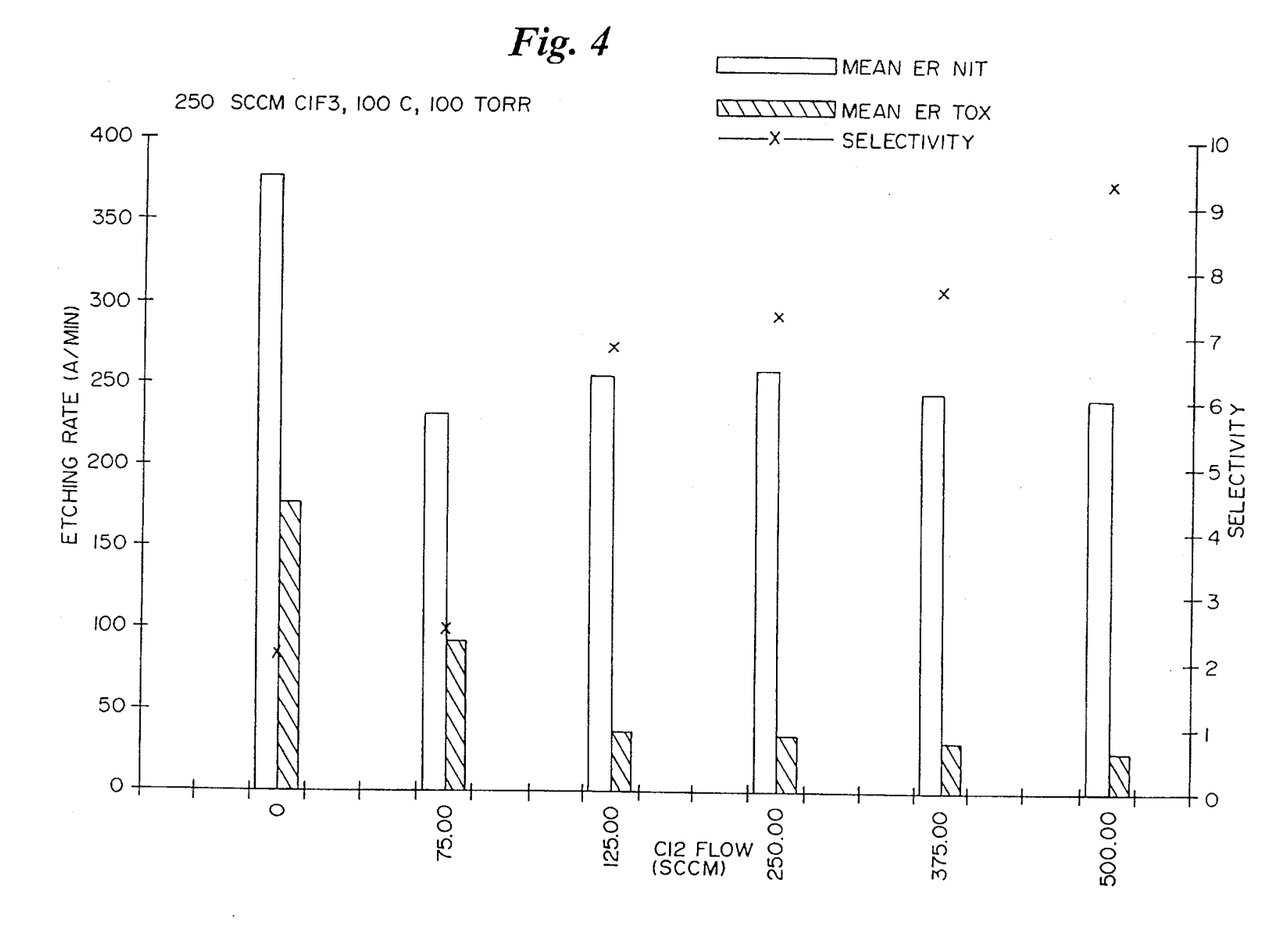
FIG. 4 is a graph showing the effect of $Cl_2$ additions on silicon nitride-to-thermal oxide etching rate selectivity in UV/$ClF_3$ etching at a constant 0.25 $ClF_3$ fraction and 100° C. initial wafer temperature.

Wafers were processed as in the previous example except that $ClF_3$ flow rate was 250 sccm, the initial temperature was 100° C., pressure was 100 torr and chlorine gas was introduced at rates as shown in FIG. 4. Under these conditions improvements in selectivity from 4:1 with no $Cl_2$, to 10:1 with a $Cl_2$/$ClF_3$ ratio of 2 were obtained. Neither $Si_3N_4$ or $SiO_2$ were measured at substantial rates with UV/$Cl_2$ only.

Figure 5:
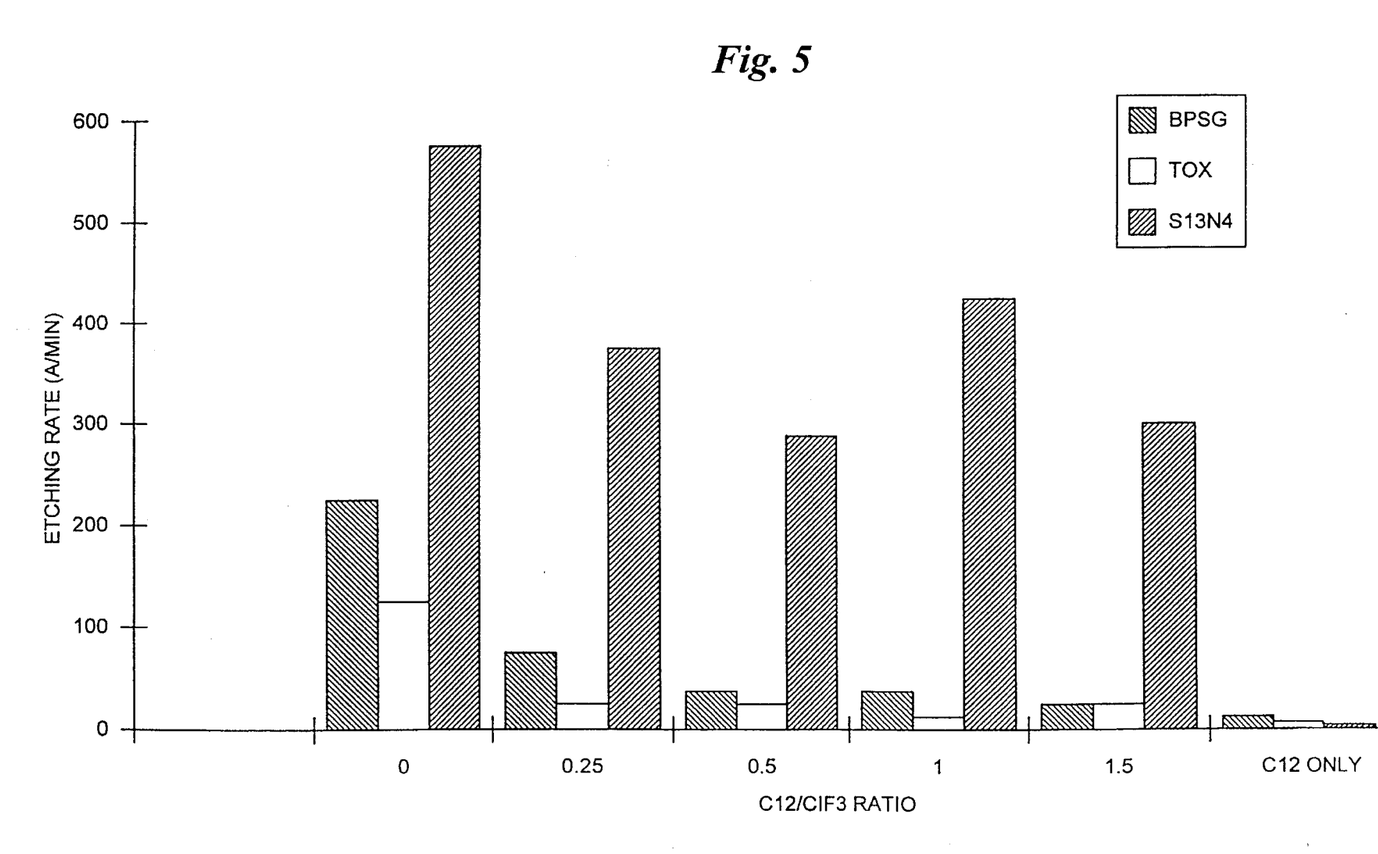
FIG. 5 is a graph showing the effect of $Cl_2$ additions on silicon nitride-to-thermal oxide etching rate selectivity in UV/$ClF_3$ etching at a constant 500 sccm $ClF_3$ flow and 150° C. initial wafer temperature.

The effect of $Cl_2$ additions at $ClF_3$ flow rate of 500 sccm and initial wafer temperature of 150° C. is presented in FIG. 5. The total flow rate was held at 1000 sccm with the remainder of the flow being made up by $N_2$, with the exception of the run at the 1.5:1 $Cl_2$ to $ClF_3$ ratio in which a total flow of 1250 sccm was used. For the chlorine only process 500 sccm chlorine was flowed with 500 sccm nitrogen. Additions of 25% chlorine were found to increase nitride-to-oxide etching selectivity to over 20, and silicon oxide etching was nearly completely suppressed. This allows extensive over-etching of the nitride films without breakthrough of the pad oxide layer. Under conditions in which no nitrogen diluent was present (500 sccm $ClF_3$, 500 sccm $Cl_2$), an etching selectivity ratio of 90:1 was measured.

The data presented in FIGS. 4 and 5 suggest that the mechanism for $Cl_2$ suppression depends on the photolytic production efficiency for Cl atoms and consequently it is believed that bromine additions will have a qualitatively similar effect.

EXAMPLE 3

Figure 6:
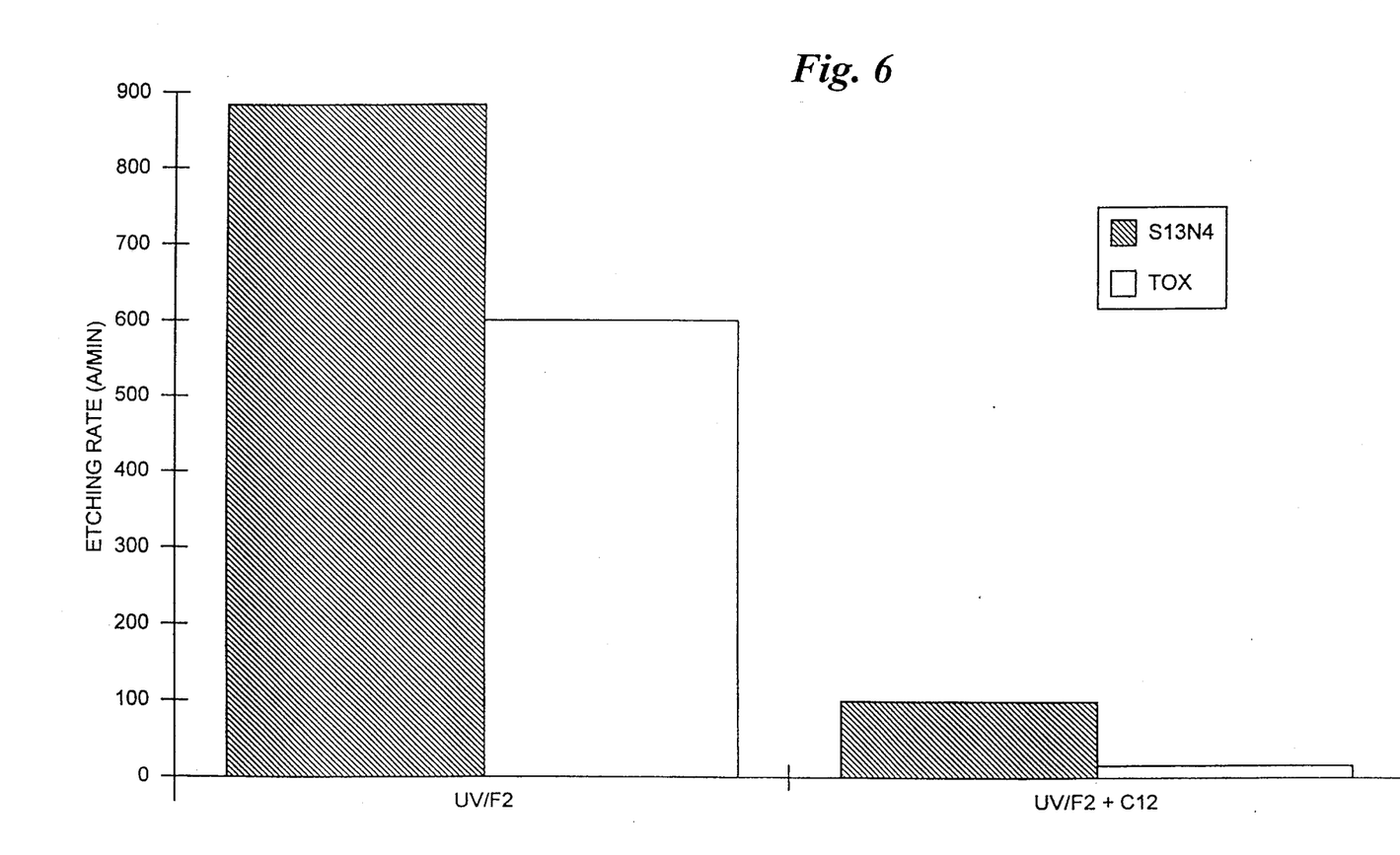
FIG. 6 is a graph comparing UV/$F_2$ and UV/$F_2$+$Cl_2$ etching of $Si_3N_4$, thermal oxide, and BPSG films.

Similar etching results to those obtained in Example 2 may be achieved using $F_2$, which is efficiently photo dissociated by 200–400 nm light or other fluorine-bearing gases which are efficiently photo dissociated in the UV. FIG. 6 shows results of UV/$F_2$ and UV/$F_2$+$Cl_2$ etching of $Si_3N_4$ as well as undoped silicon oxide. Conditions were 100 torr pressure, 100° C. initial wafer temperature, 500 sccm $F_2$, 500 sccm $N_2$ for UV/$F_2$ and 500 sccm $F_2$, 500 sccm $Cl_2$ for UV/$F_2$+$Cl_2$. UV/$F_2$ was found to etch all films at rates greater than UV/$ClF_3$ at similar temperatures and flow rates. The addition of $Cl_2$, however, was again found to nearly completely suppress the etching of silicon oxide, resulting in a highly selective etching process for $Si_3N_4$.

EXAMPLE 4

Figure 7:
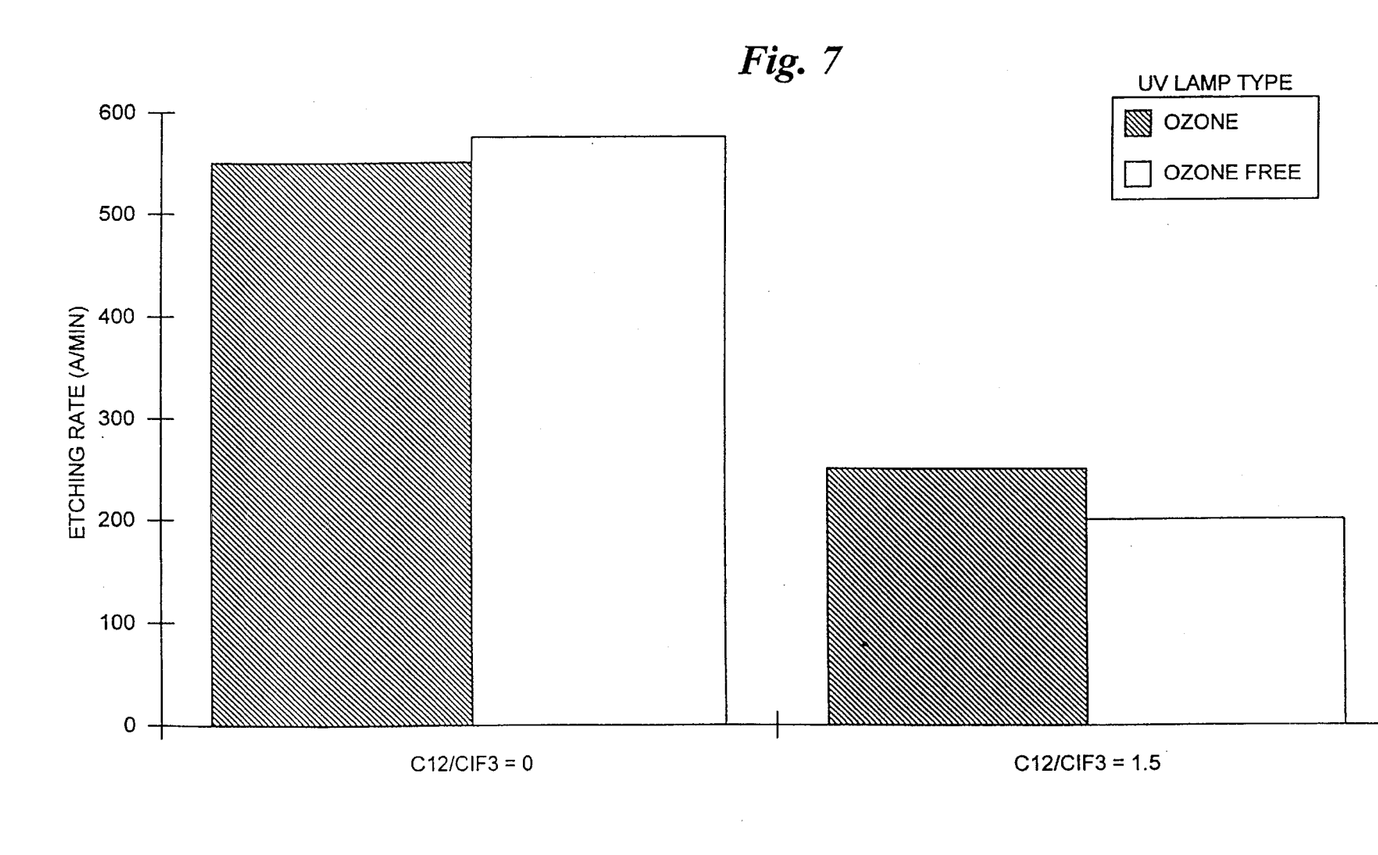
FIG. 7 is a graph showing comparison of UV/$ClF_3$ and UV/$ClF_3$+$Cl_2$ etching with an ozone generating versus and ozone free medium pressure mercury are lamp.

Shown in FIG. 7 is the effect of using an ozone producing (180–400 nm) versus an ozone free (240–400 nm) UV lamp on the UV/$ClF_3$ etching of $Si_3N_4$. Conditions were 100 torr pressure, 150° C. initial wafer temperature. The first gas mixture was 500 sccm $ClF_3$, 500 sccm $N_2$ and the second gas mixture was 500 sccm $ClF_3$, 750 sccm $Cl_2$. No significant reduction in etching rate was noted in the silicon nitride etch rate when using the ozone free lamp. Consequently, for purposes of this invention, ozone-free UV sources, which provide an integrated intensity at the substrate surface over the range of 240–400 nm of at least 50 mW/cm$^2$, more preferably at least 200 mW/cm$^2$, are considered suitable. This has particular advantage in commercial processes where worker safety and health are important.

What is claimed is:

1. A method of removing silicon nitride from a substrate, the method comprising placing the substrate in a gaseous environment comprising at least one first gas and at least one second gas, the first gas being a fluorine-containing gas which can be photodissociated by UV radiation to produce atomic fluorine and the second gas being a chlorine-containing or a bromine containing gas which can be photodissociated by UV radiation to produce atomic chlorine or bromine, and exposing the substrate to UV irradiation in the presence of the gaseous environment.

2. A method as in claim 1 wherein the gaseous environment is substantially free of plasma products.

3. A method as in claim 1 wherein the first gas is selected from the group consisting of fluorine, fluorine interhalogens, fluorides of sulfur and xenon difluoride.

4. A method as in claim 1 wherein the substrate comprises silicon or silicon oxide.

5. A method as in claim 1 wherein the gaseous environment further comprises a third gas, the third gas being an inert gas.

6. A method as in claim 5 wherein the third gas is selected from the group consisting of helium (He), argon (Ar), and nitrogen ($N_2$).

7. A method as in claim 1 wherein the substrate further comprises on at least a portion of the surface thereof a silicon oxide material which is desired to be retained on the substrate.

8. A method as in claim 7 wherein the silicon oxide material comprises a doped oxide film, a CVD oxide film, or a thermal oxide film.

9. A method as in claim 8 wherein the doped oxide is selected from the group consisting of boron and phosphorus doped silica glass, phosphorous doped silica glass, boron doped silica glass, and spin on glass.

10. A method as in claim 7 wherein the silicon oxide material desired to be retained comprises a thermally grown field oxide formed as a result of a LOCOS process.

11. A method as in claim 1 wherein the silicon nitride material to be etched is part of a composite stack of materials which includes at least one material selected from the group consisting of silicon oxynitride, polysilicon, and silicon oxide.

12. A method as in claim 1 wherein the silicon nitride is a mask layer for a LOCOS process on a silicon substrate.

13. A method as in claim 12 wherein a thermally grown pad oxide layer is located between the silicon substrate and the silicon nitride mask layer, the method being conducted under conditions of time, gas flow rates, UV intensity, first and second gas ratios and temperature such that the pad oxide layer is not penetrated.

14. A method as in claim 13 wherein a polysilicon layer is located between the pad oxide layer and the silicon nitride mask layer and the method conducted for sufficient time to remove the polysilicon layer as well as the silicon nitride mask layer.

15. A method as in claim 1 wherein the silicon nitride to be removed has an over layer of silicon oxynitride.

16. A method as in claim 1 wherein the integrated intensity of the UV irradiation at the substrate surface over the range of 180–400 nm is at least 50 mW/cm$^2$, the temperature of the substrate before irradiation is in the range of 20°–400° C., and the partial pressure of said first gas is at least 10 torr.

17. A method as in claim 16, wherein the first gas is $F_2$, $ClF_3$, or $BrF_3$, the second gas is chlorine, the integrated intensity of the UV irradiation at the substrate surface over the range of 180–400 nm is at least 200 mW/cm$^2$, the pressure of the first gas is at least 20 torr and the first and second gases are present at a pressure ratio of 2:1–1:2, and the temperature of the substrate before irradiation is at least 150° C.

18. A method as in claim 1 wherein the integrated intensity of the UV irradiation at the substrate surface over the range of 240–400 nm is at least 200 mW/cm$^2$.

19. A method as in claim 1 wherein the substrate is a silicon wafer, the method further comprising the steps of:

(a) prior to said placing step, evacuating a hermetically-sealed processing chamber having a UV transparent window therein to a low base pressure and introducing the silicon wafer substrate into the processing chamber, (b) conducting said placing step by introducing into said chamber said gaseous environment, (c) conducting said exposing step by irradiating the gaseous environment and substrate in said chamber to ultraviolet light through said UV transparent window, (d) evacuating the processing chamber, and (e) removing the substrate from the processing chamber.

20. A method as in claim 1 wherein the placing step comprises introducing said first and second gases into a chamber containing said substrate and the method further comprises the step of exciting said gases by a plasma generating source prior to introducing said gases into said chamber.

21. A method as in claim 20 wherein said exciting step is accomplished with a microwave or a radio frequency energy source.

22. A method of removing silicon nitride from a substrate, the method comprising:

placing the substrate in a gaseous environment comprising at least one first gas, the first gas being a fluorine-containing gas which can be photodissociated by UV radiation to produce atomic fluorine, and exposing the substrate to UV irradiation in the presence of the gaseous environment, wherein the integrated intensity of the UV irradiation at the substrate surface over the range of 180–400 nm is at least 50 mW/cm$^2$, the temperature of the substrate before irradiation is in the range of 20°–400° C., and the partial pressure of said first gas is at least 10 torr.

23. A method as in claim 22 wherein the gaseous environment is substantially free of plasma products.

24. A method as in claim 22 wherein the placing step comprises introducing said first and second gases into a chamber containing said substrate and the method further comprises the step of exciting said gases by a plasma generating source prior to introducing said gases into said chamber.

25. A method as in claim 24 wherein said exciting step is accomplished with a microwave or a radio frequency energy source.

26. A method as in claim 22 wherein the first gas is selected from the group consisting of chlorine trifluoride, bromine trifluoride, bromine pentafluoride, iodine pentafluoride, xenon difluoride, fluorine and sulfur hexafluoride.

27. A method as in claim 22 wherein the substrate comprises silicon or silicon oxide.

28. A method as in claim 22 wherein the gaseous environment further comprises an inert gas.

29. A method as in claim 22 wherein the integrated intensity of the UV irradiation at the substrate surface over the range of 180–400 nm is at least 200 mW/cm$^2$.

30. A method as in claim 22 wherein the integrated intensity of the UV irradiation at the substrate surface over the range of 240–400 nm is at least 200 mW/cm$^2$.

31. A method as in claim 22 wherein the partial pressure of the first gas is in the range of 10 torr–760 torr.

32. A method as in claim 31 wherein the partial pressure of the first gas is at least 50 torr, the temperature of the substrate before irradiation is 150°–250° C., and the integrated intensity of the UV irradiation at the substrate surface over the range of 180–400 nm is at least 200 mW/cm$^2$.

33. A method as in claim 22 wherein the temperature of the substrate before irradiation is at least 150° C.

34. A method as in claim 22 wherein the method produces a silicon nitride removal rate of at least 100 Å/min.

35. A method as in claim 34 wherein said silicon nitride removal rate is at least 500 Å/min.

* * * * *